(12) United States Patent
Furukawa

(10) Patent No.: US 7,808,542 B2
(45) Date of Patent: Oct. 5, 2010

(54) SOLID STATE IMAGING DEVICE CONTAINING MULTI-LAYERED INNER LENSES AND IMAGING APPARATUS

(75) Inventor: Junichi Furukawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 298 days.

(21) Appl. No.: 11/900,287

(22) Filed: Sep. 11, 2007

(65) Prior Publication Data
US 2008/0174689 A1  Jul. 24, 2008

(30) Foreign Application Priority Data
Oct. 5, 2006   (JP)   .............. P2006-274219

(51) Int. Cl.
*H04N 5/225* (2006.01)
(52) U.S. Cl. ............................................. 348/340
(58) Field of Classification Search ............... None
See application file for complete search history.

(56) References Cited

U.S. PATENT DOCUMENTS

| | | | |
|---|---|---|---|
| 4,721,999 A * | 1/1988 | Takemura et al. | 348/276 |
| 6,271,900 B1 * | 8/2001 | Li | 349/95 |
| 6,614,479 B1 * | 9/2003 | Fukusho et al. | 348/340 |
| 7,397,510 B2 * | 7/2008 | Yasuda | 348/356 |
| 2004/0105021 A1 * | 6/2004 | Hu | 348/272 |
| 2006/0066922 A1 * | 3/2006 | Nishi | 358/482 |

FOREIGN PATENT DOCUMENTS

| | | |
|---|---|---|
| JP | 10-308505 | 11/1998 |
| JP | 2002-151670 | 5/2002 |
| JP | 2004-304148 | 10/2004 |
| JP | 2005-012189 | 1/2005 |
| JP | 2006-120845 | 5/2006 |
| JP | 2006-202907 | 8/2006 |
| JP | 2006-237245 | 9/2006 |

OTHER PUBLICATIONS

Translation of Japanese Publication JP2004-304148, Toumiya Yoshitetsu, Oct. 2004*

* cited by examiner

*Primary Examiner*—Jason Chan
*Assistant Examiner*—Nicholas G Giles
(74) *Attorney, Agent, or Firm*—Robert J. Depke; Rockey, Depke & Lyons, LLC

(57) ABSTRACT

A solid-state imaging device includes: a semiconductor substrate on which multiple pixels are provided, each of the pixels having a photoelectric converting section; multiple insulating films stacked on the semiconductor substrate; a wiring film provided between the multiple insulating films; an intralayer lens provided for each photoelectric converting section between the multiple insulating films; an optical filter provided for each photoelectric converting section on the insulating film; and an on-chip lens provided for each photoelectric converting section on the optical filter, wherein at least one intralayer lenses and on-chip lens has a different structure for each pixel in accordance with the characteristic optical filter.

10 Claims, 11 Drawing Sheets

SOLID STATE IMAGING DEVICE CONTAINING MULTI-LAYERED INNER LENSES AND IMAGING APPARATUS

CROSS REFERENCES TO RELATED APPLICATIONS

The present invention contains subject matter related to Japanese Patent Applications JP 2006-274219 filed in the Japanese Patent Office on Oct. 5, 2006, the entire contents of which being incorporated herein by reference.

BACKGROUND OF THE INVENTION

1. Field of the Invention

The present invention relates to a solid state imaging device such as a CMOS image sensor including an optical filter such as a color filter having different wavelength characteristics for multiple pixels and further to an imaging apparatus for a camera or a cellular phone, for example, including the solid state imaging device.

2. Description of the Related Art

A solid state imaging device having an intralayer lens or an on-chip lens forming a micro lens surface corresponding to a photoreceptive section of each pixel has been provided in a CMOS image sensor from the past. For example, multiple wiring layers and interlayer insulating films are stacked on a semiconductor substrate having a photodiode and a transistor, and an intralayer lens is placed therebetween. Furthermore, an on-chip color filter and a micro lens are placed thereon through a flattening film (refer to JP-A-2004-304148, for example).

FIGS. 12 and 13 are section diagrams showing an example of the stacked layer structure in a CMOS image sensor in the past.

In the figures, a photoreceptive section 211 of photodiodes of multiple pixels is provided in the upper layer part of a silicon substrate 200. Notably, a pixel transistor circuit included in each pixel is omitted in FIGS. 12 and 13.

A flattening film (interlayer insulating film) 216 and wiring 210 is provided on the upper surface of the silicon substrate 200 through a gate insulating film 200A and a gate electrode, not shown, and an interlayer lens 209 is provided thereon. Two flattening films (interlayer insulating films) 215 and 214 and wiring 208 and 206 are provided thereon, and an uppermost flattening film 213 is provided thereon.

Then, color filters 202, 203 and 204 corresponding to respective pixels are placed on the flattening film 213. Notably, FIG. 12 shows a section where the red filter 202 and the green filter 203 appear, and FIG. 13 shows a section where the green filter 203 and the blue filter 204 appear.

An on-chip lens 201 is further provided on the color filters 202, 203 and 204 through a protective film.

SUMMARY OF THE INVENTION

By the way, in the CMOS image sensor as described above, many wiring films are provided on the photoreceptive section, and the distance between the uppermost micro lens (top lens) and the photoreceptive section increases. Then, the light gathering states of pixels for different colors may not be optimized in accordance with the differences in wavelength of light through the color filters. Therefore, the light gathering states at central and peripheral photoreceptive section for each color differ due to the aperture of a camera lens and/or differences in incident angle at and the central and peripheral photoreceptive section. As a result, an unevenness of color shading, for example, may occur.

This is also true in a case with an intralayer lens as in the example in the past.

Accordingly, it is desirable to provide a solid state imaging device and imaging apparatus that can optimize the input light characteristic to the photoreceptive section of an optical filter provided in each pixel.

According to an embodiment of the invention, there is provided a solid-state imaging device including a semiconductor substrate on which multiple pixels are provided, each of the pixels having a photoelectric converting section, multiple insulating films stacked on the semiconductor substrate, a wiring film provided between the multiple insulating film, an intralayer lens provided for each of the photoelectric converting section between the multiple insulating film, an optical filter provided for each of the photoelectric converting section on the insulating film, and an on-chip lens provided for each of the photoelectric converting section on the optical filter, wherein at least one of the intralayer lenses and on-chip lens has a different structure for each pixel in accordance with the characteristic of the optical filter.

According to another embodiment of the invention, there is provided an imaging apparatus including a solid state imaging device imaging a subject, an imaging optical system forming a subject image in a photoreceptive section of the solid state imaging device, a drive/control section driving the imaging optical system, a signal processing section performing signal processing on the output signal from the solid state imaging device and generating an image signal, a recording section recording the image signal generated by the signal processing section, an output section outputting the image signal generated by the signal processing section, and an operating section inputting signals for controlling an imaging operation, wherein the solid state imaging device comprises a semiconductor substrate on which multiple pixels are provided, each of the pixels having a photoelectric converting section, multiple insulating films stacked on the semiconductor substrate, a wiring film provided between the multiple insulating film, an intralayer lens provided for each of the photoelectric converting section between the multiple insulating film, an optical filter provided for each of the photoelectric converting section on the insulating film, and an on-chip lens provided for each of the photoelectric converting section on the optical filter, in which at least one of the intralayer lenses and on-chip lens has a different structure for each pixel in accordance with the characteristic of the optical filter.

The solid state imaging device and imaging apparatus according to the embodiments of the invention can optimize the input light characteristic to the photoreceptive section of an optical filter provided for each pixel since the intralayer lens and on-chip lens have a different structure for each pixel in accordance with the characteristic of the optical filter.

DESCRIPTION OF THE PREFERRED EMBODIMENTS

Figure 1:
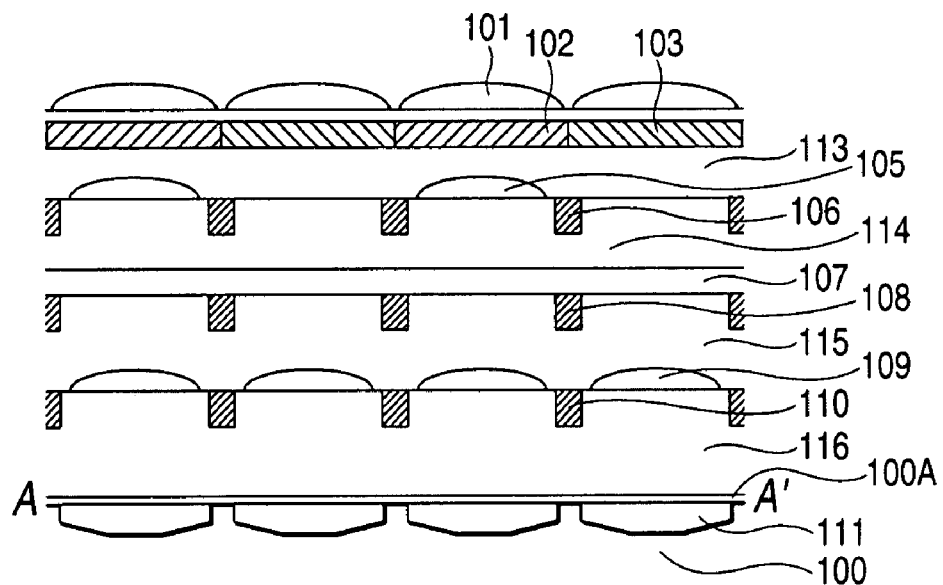
FIG. 1 is a section view showing the stacked layer structure of a CMOS image sensor according to an embodiment of the invention.
Figure 2:
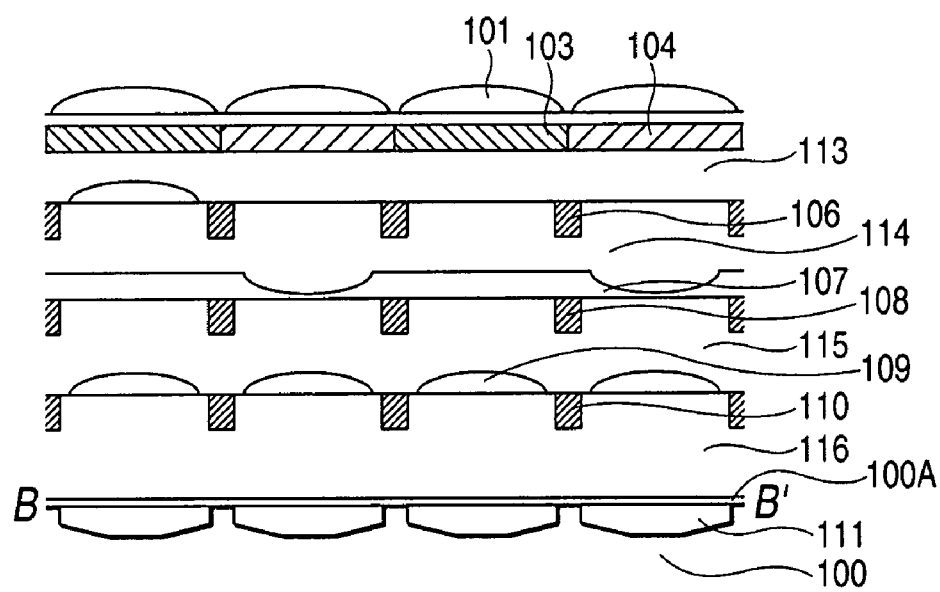
FIG. 2 is a section view showing the stacked layer structure of a CMOS image sensor according to the embodiment of the invention.

FIGS. 1 and 2 are section views showing an example of the stacked structure in a solid state imaging device (CMOS image sensor) according to an embodiment of the invention.

Figure 3:
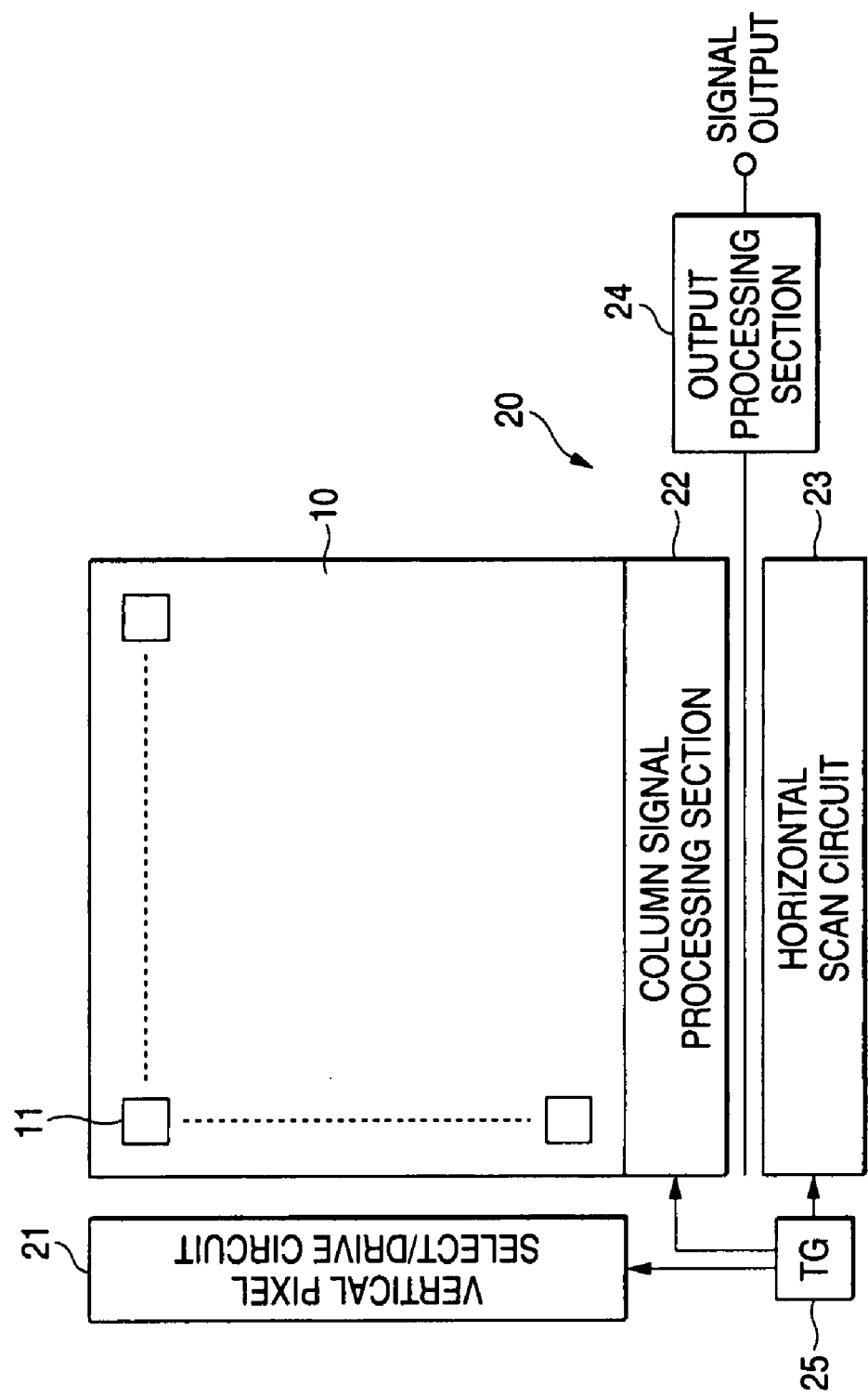
FIG. 3 is a block diagram schematically showing the CMOS image sensor shown in FIG. 1.
Figure 4:
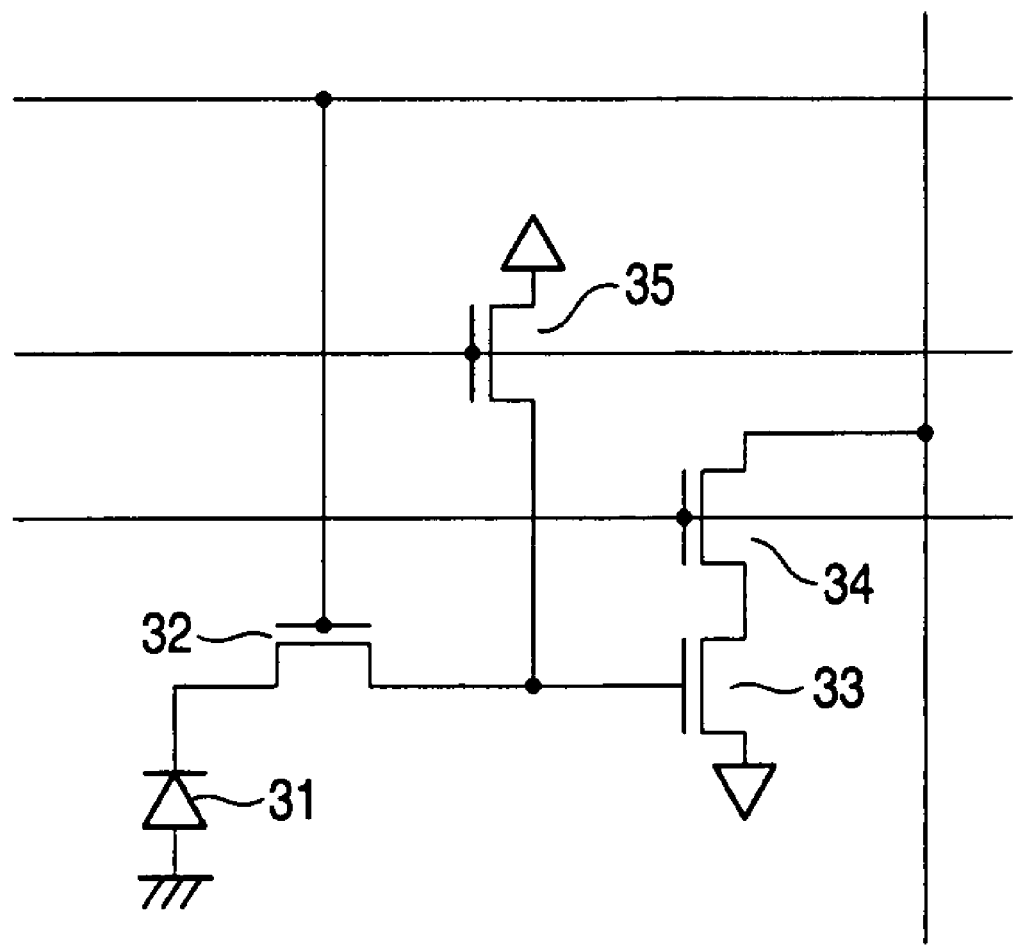
FIG. 4 is a circuit diagram showing the pixel construction of the CMOS image sensor shown in FIG. 1.

FIG. 3 is a block diagram schematically showing the CMOS image sensor shown in FIG. 1, and FIG. 4 is a circuit diagram showing the pixel construction of the CMOS image sensor shown in FIG. 1.

Figure 5:
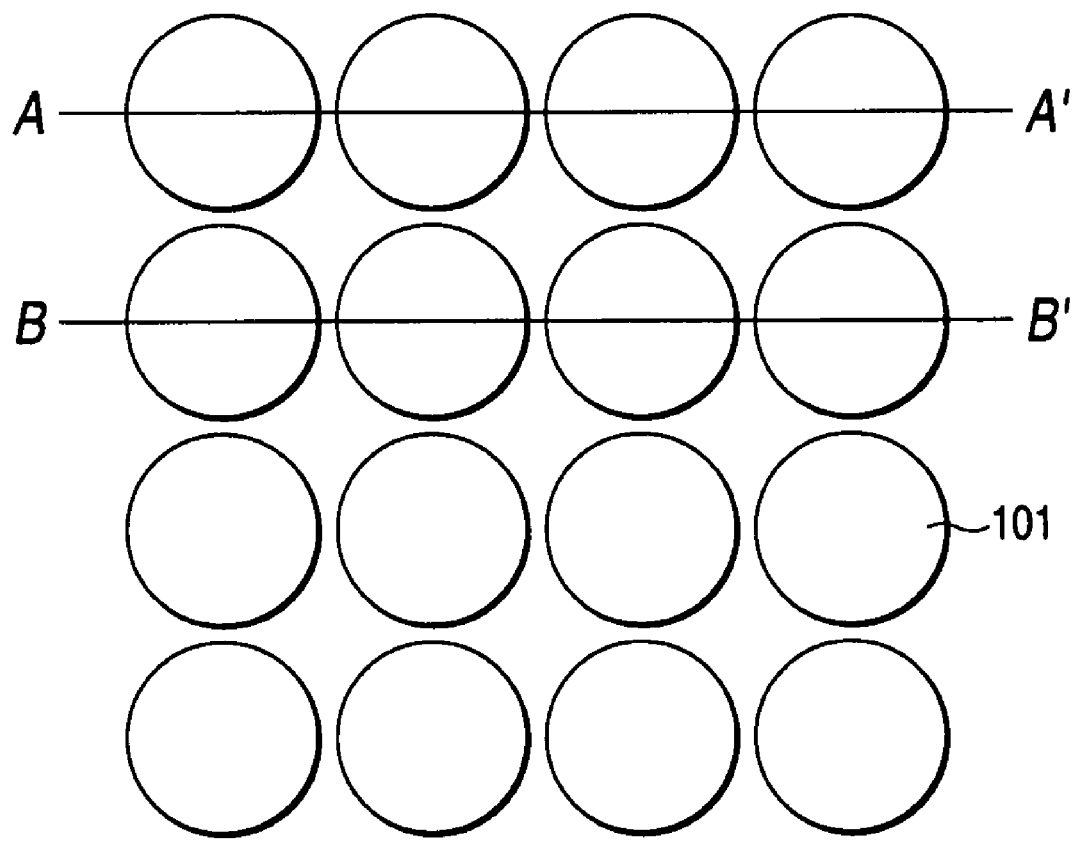
FIG. 5 is a plan view showing a pattern of top lenses in the CMOS image sensor shown in FIG. 1.
Figure 6:
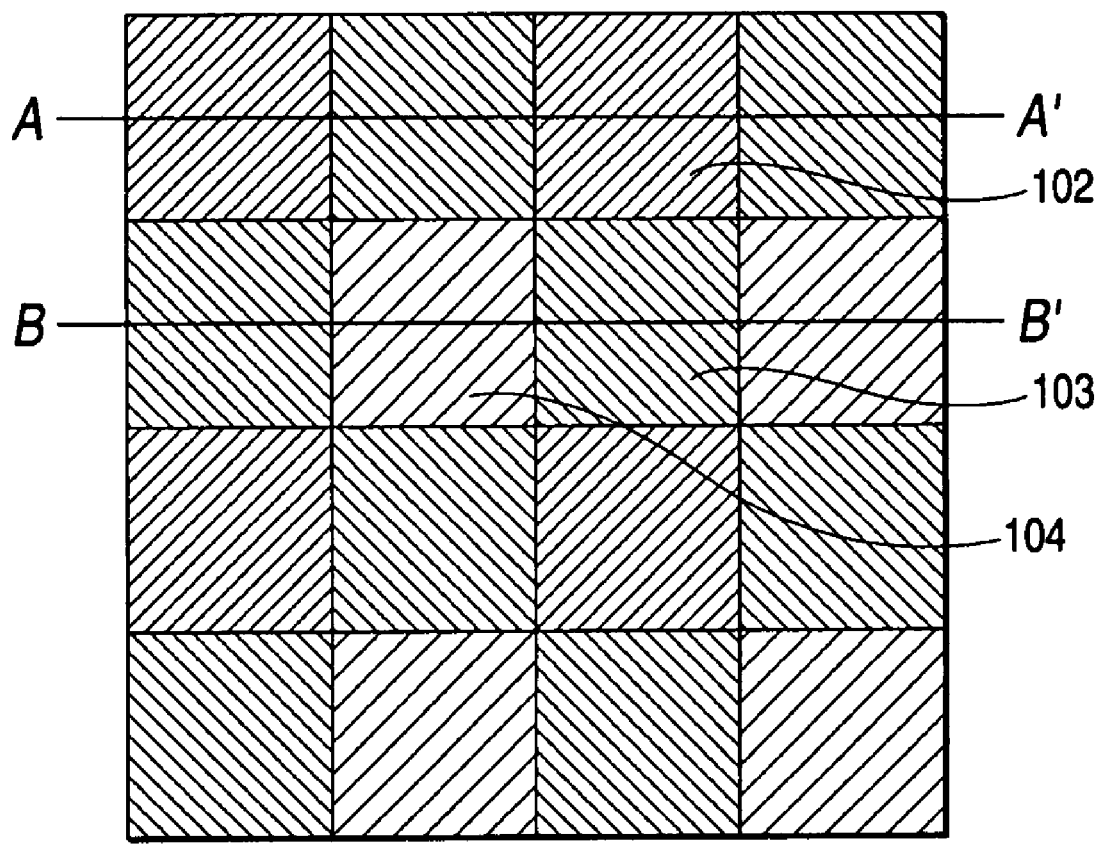
FIG. 6 is a plan view showing a pattern of color filter layers in the CMOS image sensor shown in FIG. 1.
Figure 7:
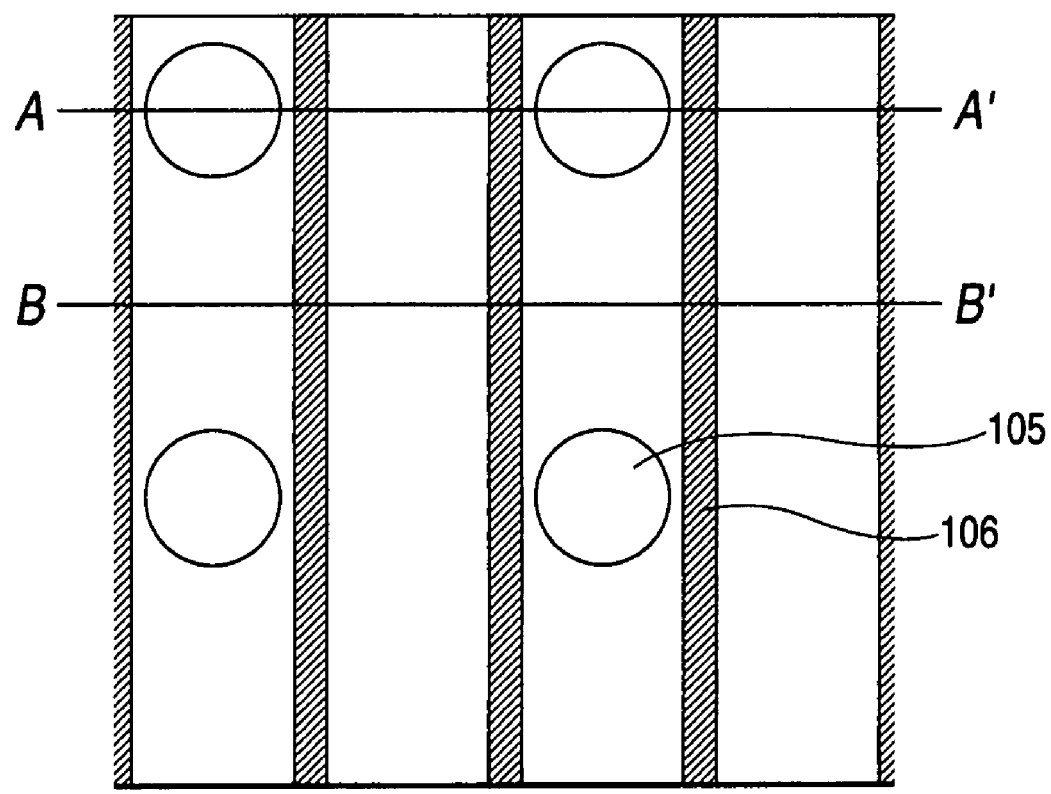
FIG. 7 is a plan view showing the layout of the micro lens layers in accordance with the construction of the wiring and color filter in the CMOS image sensor shown in FIG. 1.
Figure 8:
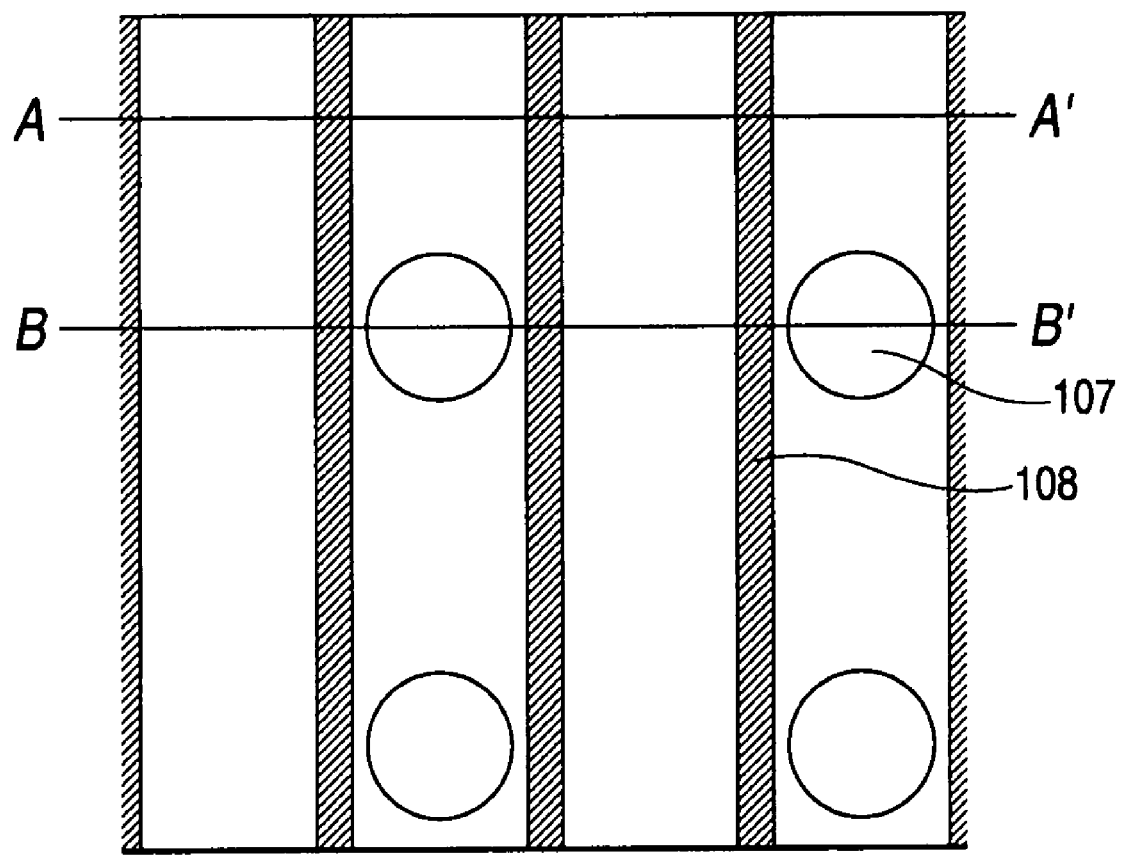
FIG. 8 is a plan view showing the layout of the micro lens layers in accordance with the construction of the wiring and color filter in the CMOS image sensor shown in FIG. 1.
Figure 9:
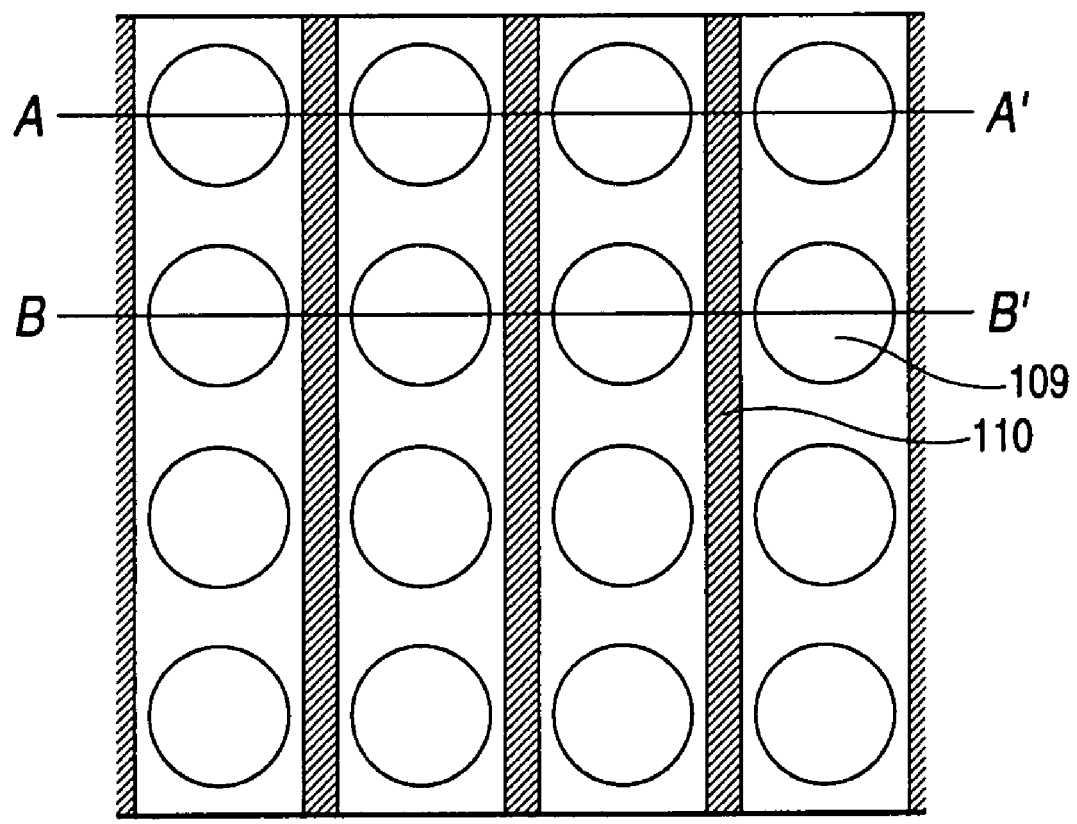
FIG. 9 is a plan view showing the layout of the micro lens layers in accordance with the construction of the wiring and color filter in the CMOS image sensor shown in FIG. 1.

FIG. 5 is a plan view showing a pattern of top lenses in the CMOS image sensor shown in FIG. 1, FIG. 6 is a plan view showing a pattern of color filter layers in the CMOS image sensor shown in FIG. 1. FIGS. 7 to 9 are plan views showing the layouts of the micro lens layers in accordance with the construction of the wiring and color filters.

Figure 10:
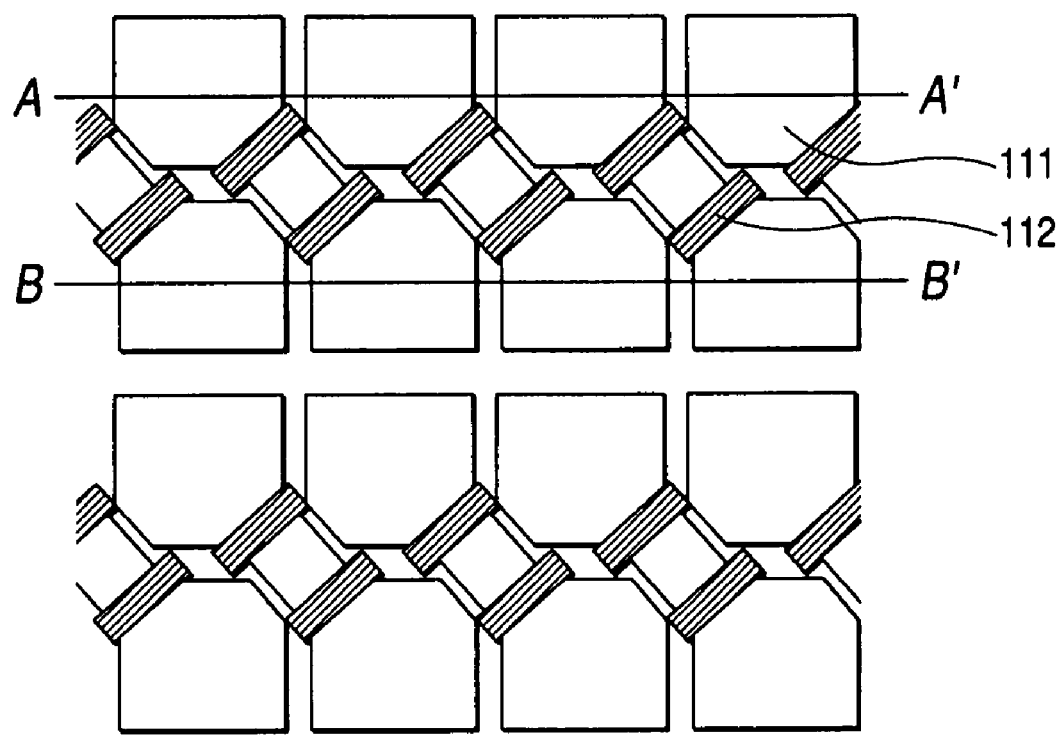
FIG. 10 is a plan view showing a part of the photoreceptive section and pixel transistor on the silicon substrate in the CMOS image sensor shown in FIG. 1.

FIG. 10 is a plan view showing a part of the photoreceptive section and pixel transistor on the silicon substrate.

The section views shown in FIGS. 1 and 2 are taken by the lines A-A' and B-B' in FIGS. 5 to 10.

A CMOS image sensor according to the embodiment will be first described with reference to FIGS. 3 and 4.

As shown in FIG. 3, the CMOS image sensor has an imaging area 10 and a peripheral circuit area 20 on one chip. The imaging area 10 includes a pixel array section in which multiple pixels 11 including photodiodes (photoelectric converting sections) are placed in the two-dimensional direction. The peripheral circuit area 20 is provided outside of the imaging area 10.

The peripheral circuit area 20 includes a vertical pixel select/drive circuit 21, a column signal processing section 22, a horizontal scan circuit 23, an output processing section 24 and a timing generator 25. The vertical pixel select/drive circuit 21 reads out a pixel signal from each pixel column by supplying a control pulse to the pixel array section. The column signal processing section 22 performs signal processing such as noise processing on the column signal read out from the pixel array section. The horizontal scan circuit 23 horizontally transfers the pixel signal processed by the column signal processing section 22. The output processing section 24 outputs the pixel signal transferred from the horizontal scan circuit 23 as an image signal. The timing generator 25 supplies a timing signal to the sections.

As shown in FIG. 4, each of the pixels 11 of the imaging area 10 has pixel transistors including a photodiode 31, a readout transistor (transfer gate) 32, an amplifier transistor 33, a select transistor 34, and a reset transistor 35. The photodiode 31 generates a signal charge in accordance with the amount of received light. The readout transistor (transfer gate) 32 reads out the signal charge of the photodiode 31 to an FD (floating diffusion). The amplifier transistor 33 generates a pixel signal in accordance with the potential of the FD. The select transistor 34 selects the output timing of a pixel signal. The reset transistor 35 resets the FD. Each of the pixels 11 further includes wiring and other elements for exchanging signals or power with the pixel array section and the peripheral circuit area.

Next, with reference to FIGS. 1 and 2, the stacked layer structure of the CMOS image sensor according to this embodiment will be described.

In the figures, a photoreceptive section 111 of the photodiodes of the multiple pixels is provided in the upper layer part of the silicon substrate 100. The pixel transistor circuits included in each pixel are omitted in FIGS. 1 and 2. FIG. 10 shows the layout of the photoreceptive section 111 and a transfer transistor 112 of the photodiode, and the transfer transistor 112 is placed at a corner part of the photoreceptive section 111. FIG. 10 schematically shows the layout. In reality, the transistor is much smaller than the photoreceptive section and is provided along with other transistors such as the amplifier, select and reset transistors.

Figure 12:
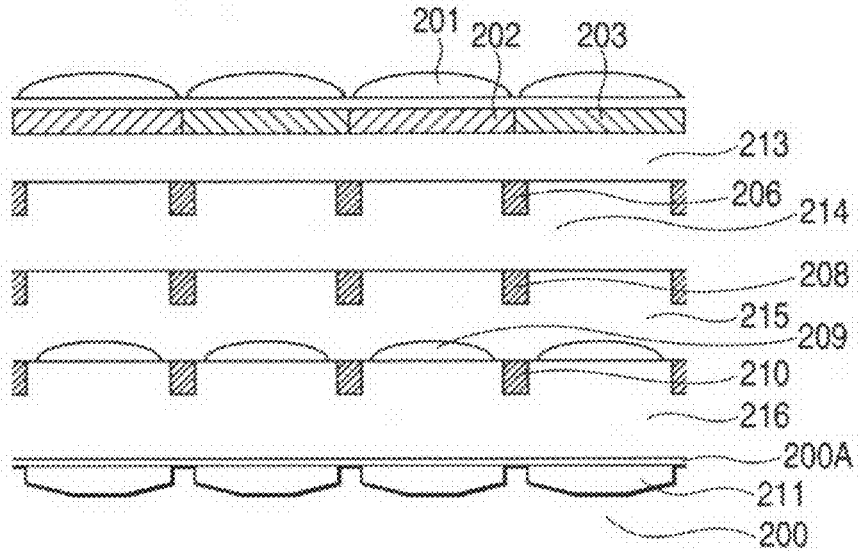
FIG. 12 is a section view showing an example of the stacked layer structure of a CMOS image sensor in the past.
Figure 13:
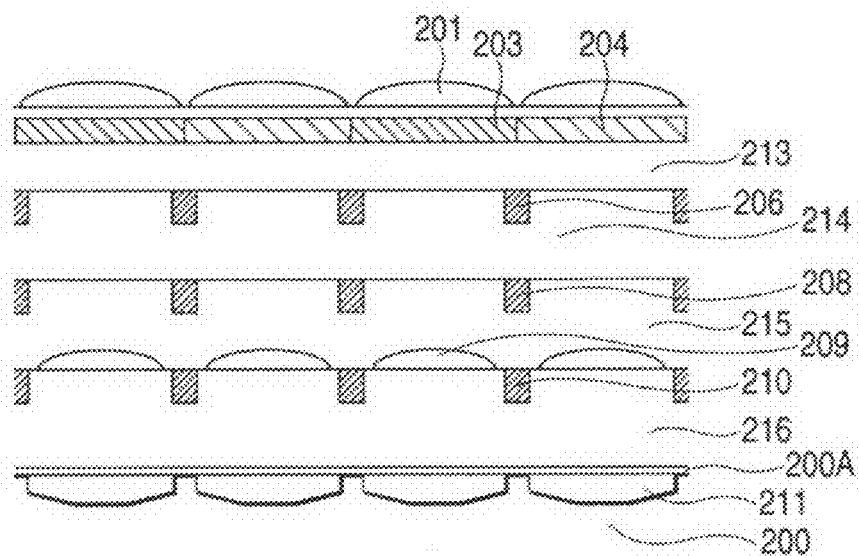
FIG. 13 is a section view showing the example of the stacked layer structure of the CMOS image sensor in the past.

A flattening film (interlayer insulating film) 116 and wiring 110 are provided on the top surface of the silicon substrate 100 through a gate insulating film 100A and a gate electrode, not shown, for example, and an intralayer lens 109 is provided thereon. The intralayer lens 109 is a convex lens for each of all pixels as in the example in the past (FIGS. 12 and 13). The intralayer lenses 109 and wiring 110 are placed as shown in FIG. 9.

The micro lens 109 is formed by forming a lens material all over a base, patterning a resist into a convex plane shape in accordance with a lens pattern thereon, forming a lens shape by the surface tension generated by thermal fusion reflow and transferring it to the lens material by etching it back. The flattening film 116 is formed from an SiON-based film or a low-refractive-index SiN-based film. The micro lens 109 is formed from a high-refractive-index SiN-based film.

A flattening film (interlayer insulating film) 115 and wiring 108 are provided thereon, and an intralayer lens 107 is provided thereon. The intralayer lens 107 has a different construction from that of the example in the past (FIGS. 12 and 13) and is a concave lens provided only for a pixel having a blue filter 104. The intralayer lenses 107 and wiring 108 are laid out as shown in FIG. 8. The micro lens 107 is formed by forming a lens material all over a base, patterning a resist thereon into an opening form in accordance with a lens pattern and then forming it on the lens material by performing isotropic etching thereon. The flattening film 115 is formed from an SiON-based film or a low-refractive-index SiN-based film. The micro lens 107 is formed from a high-refractive-index SiN-based film.

A flattening film (interlayer insulating film) 114 and wiring 106 are provided thereon, and an intralayer lens 105 is provided thereon. The intralayer lens 105 has a different construction from that of the example in the past (FIGS. 12 and 13) and is a convex lens provided only for a pixel having a red filter 102. The intralayer lenses 105 and wiring 106 are laid out as shown in FIG. 7. The flattening film 114 is formed from an SiON-based film or a low-refractive-index SiN-based film. The micro lens 105 is formed from a high-refractive-index SiN-based film.

Next, an uppermost flattening film 113 is formed thereon, and the color filters 102, 103 and 104 corresponding to pixels are placed on the flattening film 113. FIG. 1 shows a section where the red filter 102 and the green filter 103 appear. FIG. 2 shows a section where the green filter 103 and the blue filter 104 appear. The color filters 102, 103 and 104 are laid out as shown in FIG. 6.

An on-chip lens 101 is provided on the color filters 102, 103 and 104 through a protective film. The on-chip lens 101 corresponds to all pixels as shown in FIG. 5. The flattening film 113 is formed from an SiON-based film or a low-refractive-index SiN-based film, and the micro lens 101 is formed from a high-refractive-index SiN-based film.

The selection of a convex lens or a concave lens as the intralayer lens for each color may depend on the purpose of the optimization.

As described above, in the image sensor according to this embodiment, the number of lenses and the construction of the lens (including lens curvature and/or convex lens or concave lens) may depend on the construction of color filters for the optimization of light gathering for each color. The different micro lens constructions in relation to colors of color filters can optimize the light gathering states in the photoreceptive sections of the colors, which are caused by differences in wavelength through the color filters. This can reduce an unevenness of color shading caused by different light gathering states for colors at central and peripheral photoreceptive section due to the difference in aperture of a camera lens and incident angle of light at central and peripheral photoreceptive section.

Having described above that the invention is applied to a CMOS image sensor, the invention is not limited to a CMOS image sensor. The invention is applicable to an image sensor having multiple micro lens layers. The optical filter according to the invention is not limited to the primary-color filters but may include complementary-color filters and infrared filters.

The solid state imaging device is not limited to the one having an image sensor on one chip but may have a construction in which an imaging section having an image sensor and a signal processing section and an optical system are provided as separate components in a package. Alternatively, the solid state imaging device may be integrated with a control section and/or an operating section and be used for a camera system or a cellular phone. In other words, according to the invention, a single image sensor may refer to a solid state imaging device, and a combination of the solid state imaging device and another functional part (such as a communication module or a display module) may refer to an imaging apparatus. Both solid state imaging device and imaging apparatus are included in the scope of the invention.

Specific examples of the imaging apparatus applying the invention will be described below.

Figure 11:
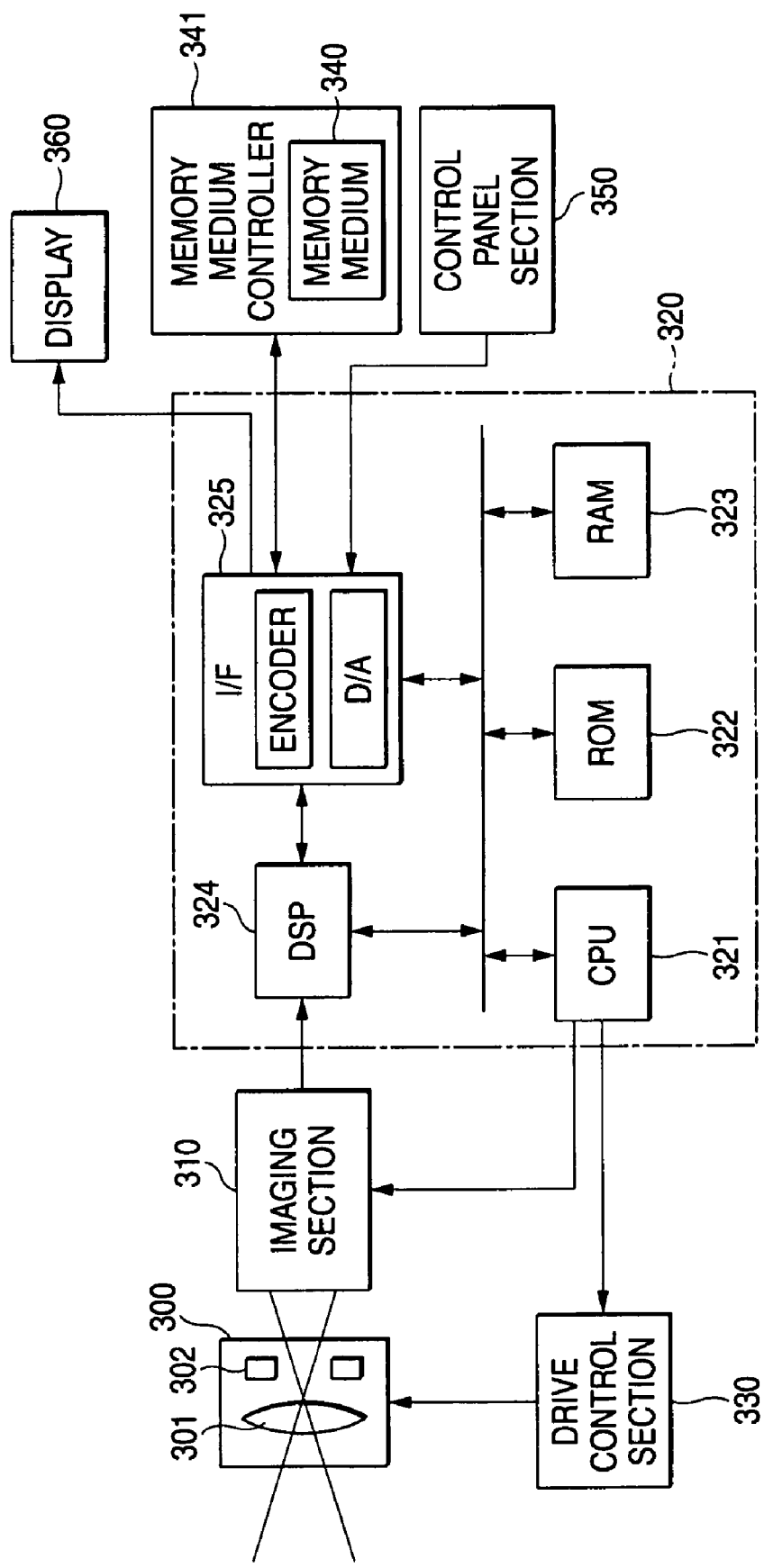
FIG. 11 is a block diagram showing a construction example of a camera apparatus including the CMOS image sensor shown in FIG. 1 as an imaging section.

FIG. 11 is a block diagram showing a construction example of a camera apparatus having the CMOS image sensor of the embodiment.

In FIG. 11, an imaging section 310 images a subject by using the CMOS image sensor shown in FIGS. 3 and 4, for example, and outputs an image signal to a system control section 320 on a main substrate. In other words, the imaging section 310 performs processing such as AGC (automatic gain control), OB (optical black) clamp, CDS (correlated double sampling), and A/D conversion on the output signals from the CMOS image sensor and generates and outputs digital image signals.

Having described the example in which image signals are converted to digital signals within the imaging section 310 and are output to the system control section 320, analog image signals may be supplied from the imaging section 310 to the system control section 320 and may be converted to digital signals in the system control section 320. Various schemes may be applied in the processing within the imaging section 310 and are not limited in particular.

An imaging optical system 300 includes a zoom lens 301 and an aperture mechanism 302 placed in a lens barrel and forms a subject image in the photoreceptive section of the CMOS image sensor. Under the control of a drive/control section 330 based on an instruction from the system control section 320, the corresponding section or sections are driven mechanically to perform control such as auto focus.

The system control section 320 includes a CPU 321, a ROM 322, a RAM 323, a DSP 324 and an external interface 325.

The CPU 321 transmits an instruction to a component of the camera apparatus through the ROM 322 and RAM 323 to control the entire system.

The DSP 324 performs signal processing on image signals from the imaging section 310 to generate video signals (such as YUV signals) of a still picture or a moving picture in a predetermined format.

The external interface 325 includes an encoder and a D/A converter and exchanges a control signal or data with an external element (that is, a display 360, a memory medium 340 and a control panel section 350 in this example) connecting to the system control section 320.

The display 360 is a small display such as a liquid crystal panel built in the camera apparatus and displays an imaged image. In addition to the small display built in a camera apparatus, a construction is apparently applicable in which image data is transmitted to an external large display apparatus to display.

A shot image may be saved in the memory medium 340 such as a memory card, and the memory medium is replaceable for the memory medium controller 341. The memory medium 340 may be a magnetic or optical disk medium instead of a memory card.

The control panel section 350 includes an input key for instructing by a user when a shooting operation is performed in the camera apparatus. The CPU 321 monitors an input signal from the control panel section 350 and performs operational control based on the contents of the input.

By applying the invention to the camera apparatus, high quality shooting can be performed on various subjects. In this construction, the combination of unit devices or/and unit modules to be included in the system, and the size of the set may be selected properly based on the actual situation of the commercialization. The imaging apparatus of the invention widely includes various changes.

In the solid state imaging device and imaging apparatus of the invention, the subject to be imaged is not limited to a person and/or scenery in a general video image. The solid state imaging device and imaging apparatus of the invention are also applicable to the imaging of a special fine image pattern as in a counterfeit bill detector or a fingerprint detector, for example. In this case, instead of the general camera apparatus shown in FIG. 11, the apparatus construction further includes a special imaging optical system and a signal processing system including pattern analysis. Also in this case, the operational effect of the invention may be fully used to implement precise image detection.

In a remote system for remote medical care, crime prevention monitoring or personal authentication, for example, the apparatus construction may include a communication module connecting to a network as described above, and wide variety of applications can be achieved.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a semiconductor substrate on which multiple pixels are provided, each of the pixels having a photoelectric converting section;
   multiple insulating films stacked on the semiconductor substrate;
   wirings provided between the multiple insulating films;
   an intralayer lens provided for each photoelectric converting section between the multiple insulating films;
   a color filter provided for each photoelectric converting section above said intralayer lenses for each pixel; and
   an on-chip lens provided for each photoelectric converting section over the optical filter,
   wherein there is a different number of concave and/or convex lenses between the color filter and the photoelectric converting section of each pixel in accordance with the color of the color filter.

2. The solid state imaging device according to claim 1, wherein there is at least one intralayer convex lens.

3. The solid state imaging device according to claim 1, wherein there is at least one intralayer concave lens.

4. The solid state imaging device according to claim 1, wherein each optical filter is a primary-colors filter.

5. The solid state imaging device according to claim 4, wherein at least one intralayer lenses and on-chip lens has a different structure for each pixel in accordance with the color of the color filter.

6. An imaging apparatus comprising:
   a solid state imaging device imaging a subject;
   an imaging optical system forming a subject image in a photoreceptive section solid state imaging device;
   a drive/control section driving the imaging optical system;
   a signal processing section performing signal processing on the output signal from the solid state imaging device;
   a recording section for recording image information generated by the signal processing section;
   an output section outputting image signals generated by the signal processing section; and
   wherein the solid state imaging device comprises:
   a semiconductor substrate on which multiple pixels are provided, each of the pixels having a photoelectric converting section;
   multiple insulating films stacked on the semiconductor substrate;
   wirings provided between the multiple insulating films;
   an intralayer lens provided for each photoelectric converting section between the multiple insulating films;
   a color filter provided for each photoelectric converting section above said intralayer lenses of each pixel; and
   an on-chip lens provided for each photoelectric converting section above the optical filter,
   wherein there is a different number of concave and/or convex lenses between the color filter and the photoelectric converting section of each pixel in accordance with the color of the color filter.

7. The imaging apparatus according to claim 6, wherein there is at least one intralayer convex lens.

8. The imaging apparatus according to claim 6, wherein there is at least one intralayer concave lens.

9. The imaging apparatus according to claim 6, wherein each optical filter is a primary-colors filter.

10. The imaging apparatus according to claim 9, wherein at least one intralayer lenses and on-chip lens has a different structure for each pixel in accordance with the color of the color filter.

* * * * *